United States Patent
Duvvury

[11] Patent Number: 5,903,032
[45] Date of Patent: *May 11, 1999

[54] POWER DEVICE INTEGRATION FOR BUILT-IN ESD ROBUSTNESS

[75] Inventor: Charvaka Duvvury, Plano, Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/798,445

[22] Filed: Feb. 10, 1997

Related U.S. Application Data

[63] Continuation of application No. 08/242,383, May 13, 1994.
[51] Int. Cl.⁶ .................................................. H01L 23/62
[52] U.S. Cl. ......................... 257/356; 257/357; 257/355
[58] Field of Search ..................................... 257/356, 357, 257/355

[56] References Cited

U.S. PATENT DOCUMENTS

| 5,012,317 | 4/1991 | Roundtree | 357/38 |
| 5,319,236 | 6/1994 | Fujihara | 257/355 |

*Primary Examiner*—Stephen D. Meier
*Attorney, Agent, or Firm*—Jacqueline J. Garner; W. James Brady, III; Richard L. Donaldson

[57] ABSTRACT

A power device having built-in ESD protection. A drain extended NMOS transistor (12) is located in a tank region (18). A silicon controlled rectifier (14) is merged with the drain extended nMOS (12) into the tank region (18). In one aspect of the invention, an anode (28) of the silicon controlled rectifier (14) is connected to a drain (24) of the drain extended nMOS (12) and a cathode (32) of the silicon controlled rectifier (14) is connected to a source (34) of the drain extended nMOS (12).

19 Claims, 5 Drawing Sheets

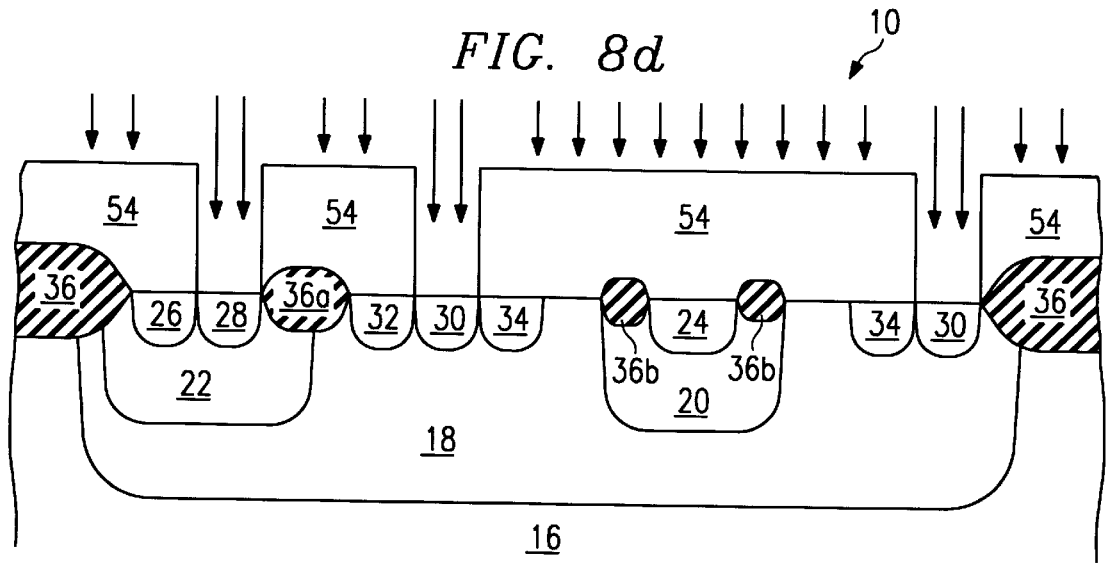
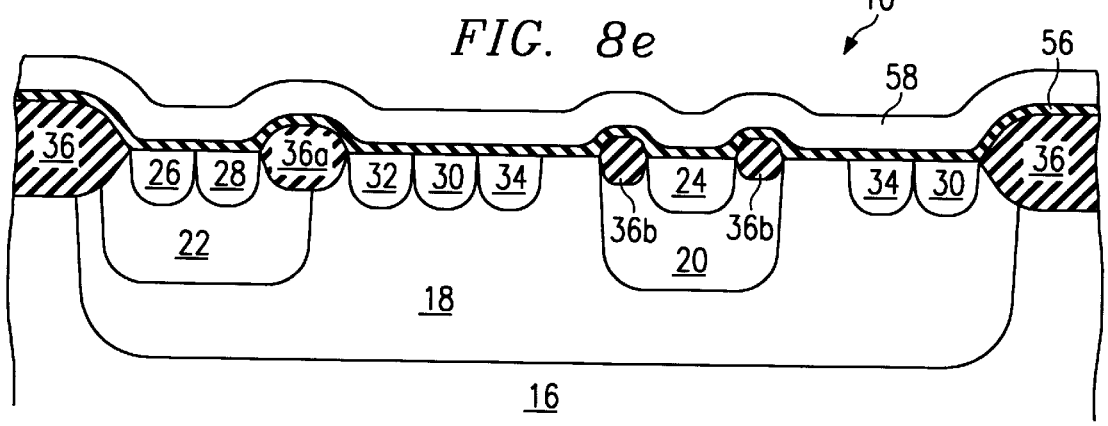
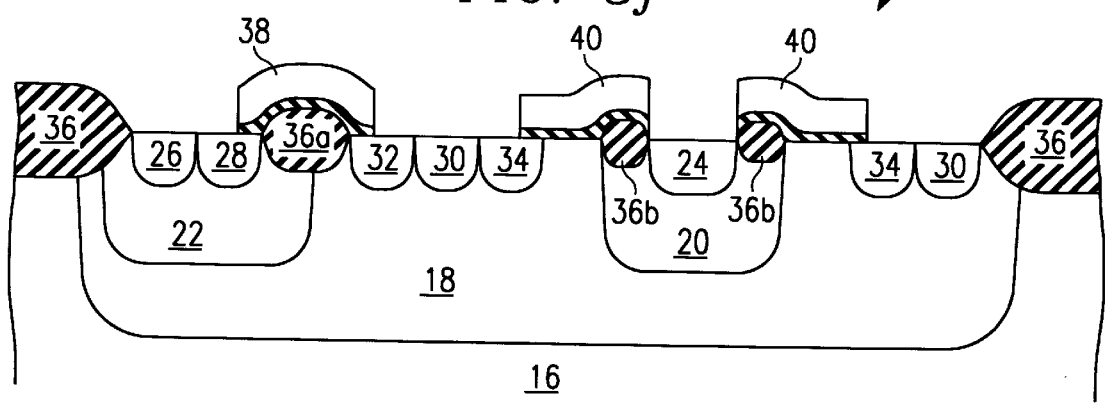

POWER DEVICE INTEGRATION FOR BUILT-IN ESD ROBUSTNESS

This application is a Continuation of application Ser. No. 08/242,383, filed May 13, 1994.

FIELD OF THE INVENTION

This invention generally relates to power devices and more specifically to ESD protection in power devices.

BACKGROUND OF THE INVENTION

Current technology trends continue to focus on high performance CMOS (complementary metal-oxide-semiconductor) and a new arena of VLSI (very-large-scale integration) called Smart Power chips is being developed. Smart Power chips are built with both low and high voltage CMOS. Power transistors on these Smart Power chips typically allow operating voltages up to 40 volts. The thrust of current research focuses on improving the transistor performance.

Smart Power chips are widely used in the automotive industry. The automotive environment is harsh and requires relatively high levels of protection against ESD and other types of transients. However, power transistors are generally weak for ESD due to their inherent device structure. Good ESD performance actually requires low power dissipation capability under high currents. This is inherent in optimized NMOS transistor structures, but not in power transistors due to the fact that the holding voltages are quite high. A high holding voltage increases the relative power dissipation under an ESD event and results in a low self-protection level.

A prior-art DEnMOS power transistor is shown in FIG. 1. The DEnMOS is built on in a p-tank 112 located in a p-type epitaxial substrate 110. The drain 116 is formed in a n-well 114. The source 118 is formed directly in the p-tank 112. The gate 120 is located partially over the p-tank and partially over a field oxide region 122 that is located between the drain 116 and the source 118. A 500 Å gate oxide 122 is located between the gate 120 and the p-tank 112. Typical channel lengths (between the source 118 edge and the n-well 114 edge) are 3–4 $\mu$m. Smaller than 3 $\mu$m channel lengths are not used because the breakdown voltage (BVdss) would be lowered for high voltage applications. Under drain avalanche, the gate oxide region 122 does not breakdown since part of the voltage is supported by the depletion in the n-well 114.

SUMMARY OF THE INVENTION

A power device having built-in ESD protection is disclosed herein. A drain extended nMOS (DEnMOS) transistor is located in a tank region. A silicon controlled rectifier is merged with the DEnMOS into the tank region. In one aspect of the invention, an anode of the silicon controlled rectifier is connected to a drain of the DEnMOS and a cathode of the silicon controlled rectifier is connected to a source of the DEnMOS.

In another aspect of the invention, the DEnMOS comprises a first well region of a second conductivity type and a first doped region of the second conductivity type located in the first well region. The first doped region forms a drain. The DEnMOS further comprises a second doped region of the second conductivity type located in the tank region (of first conductivity type) and separated from an edge of the first well region by a first spacing. The second doped region forms a source. A gate of the DEnMOS extends over the tank region between the source and the drain. The silicon controlled rectifier comprises a second well region of second conductivity type and a third doped region of first conductivity type located in the second well region and separated from an edge of the second well region by a second spacing. The third doped region forms an anode. The silicon controlled rectifier further comprises a fourth doped region of second conductivity type located in the tank region and separated from the edge of the second well region by a third spacing.

An advantage of the invention is providing a drain-extended nMOS having built-in ESD robustness.

A further advantage of the invention is providing a drain-extended nMOS having built-in ESD robustness that does not impact the I–V characteristics of the drain-extended nMOS.

A further advantage of the invention is providing a drain-extended nMOS having built-in ESD robustness that can easily be incorporated into the layout of the drain-extended nMOS.

A further advantage of the invention is providing integrated protection device for power MOSFETs.

BRIEF DESCRIPTION OF THE DRAWINGS

In the drawings:

FIGS. 8a–f are cross-sectional views of various fabrication steps in the formation of the power device of FIG. 4.

Corresponding numerals and symbols in the different figures refer to corresponding parts unless otherwise indicated.

DETAILED DESCRIPTION

The invention will be described in conjunction with a Drain-Extended nMOS (DEnMOS) for a power device such as a Smart Power Integrated Circuit (IC). For Smart Power ICs, high performance 5 V or 3.3 V CMOS circuits must be combined with high voltage (typically up to 40 V) power transistors. High voltage power transistors may be used, for example, in the output drivers of a Smart Power IC. Smart Power ICs are typically used in the automotive environment. The applications of these ICs in the harsh automotive environment demand robust ESD protection levels. Typically, a 4 kV ESD protection level is required.

Figure 2:
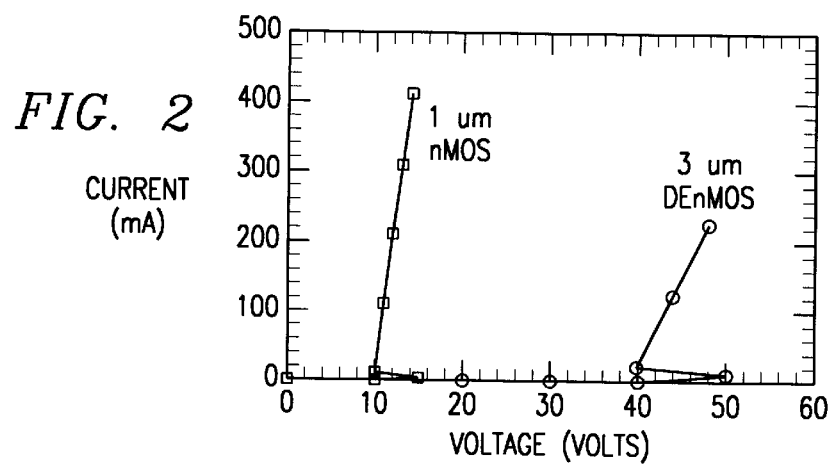
FIG. 2 is a graph of I–V characteristics for a prior art DEnMOS power transistor.

However, prior art power transistors are generally weak against the ESD threat. FIG. 2 shows the high current I–V data for a 3 $\mu$m power transistor compared with a 1 $\mu$m NMOS transistor of the same technology, both with the substrate and gates tied to ground. Although the parasitic bipolar device of the power transistor turns on, the holding voltage is quite high (on the order of 40–50 V). Since an ESD event is a high current event, this will increase the relative power dissipation under the ESD event and result in a low self-protection level.

Figure 1:
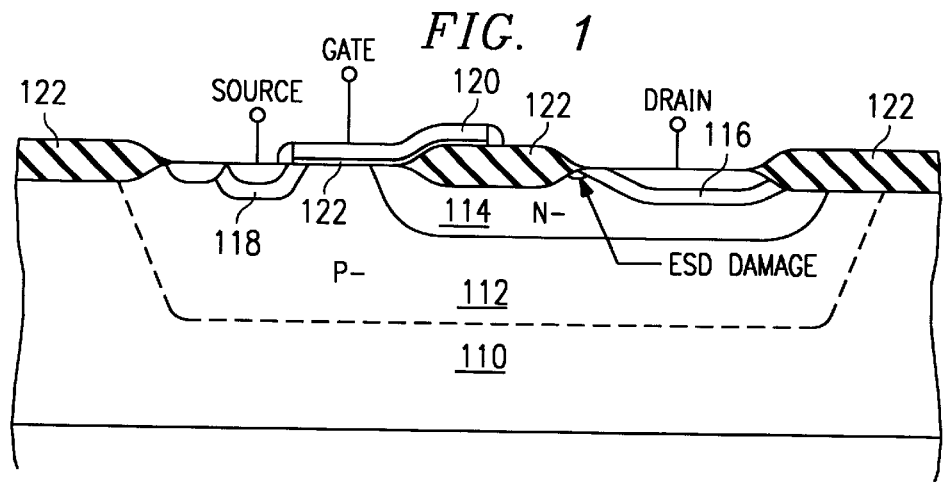
FIG. 1 is a cross-sectional view of a prior art DEnMOS power transistor.
Figure 3:
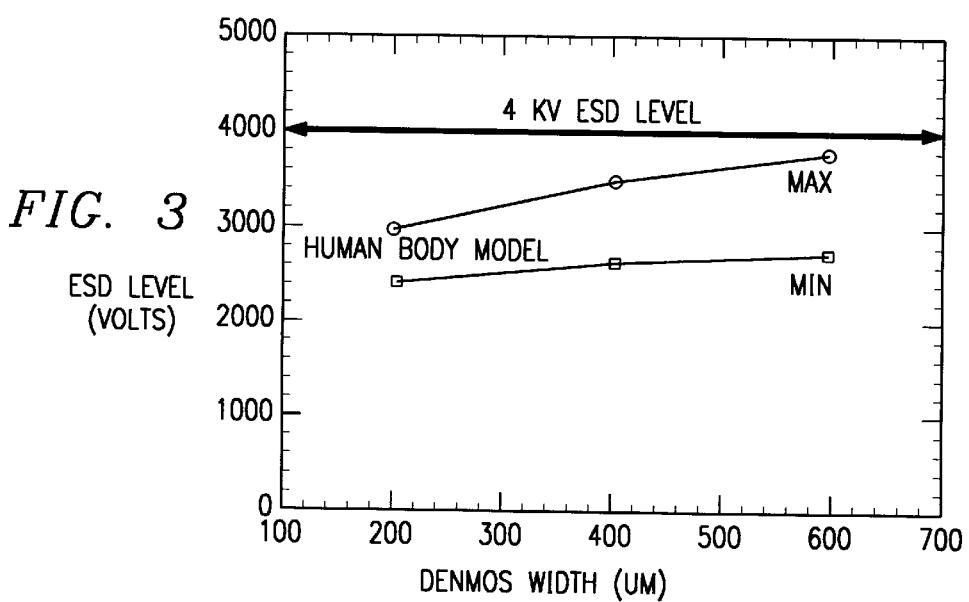
FIG. 3 is a graph of ESD data for a prior art DEnMOS power transistor.

FIG. 3 shows the ESD data for a DEnMOS as a function of channel width for the Human Body Model (HBM). The ESD levels do not scale well with width for the HBM, giving only about 3μ4 V/μm. Hence, even if the DEnMOS transistor is made large, the required 4 kV ESD level cannot be achieved. In contrast, the 1 μm transistors in this technology showed 12 V/μm of ESD levels thus ensuring protection for the 5 V CMOS. For the HBM stress, failure analysis revealed damage at the drain edge location shown in FIG. 1.

Figure 4:
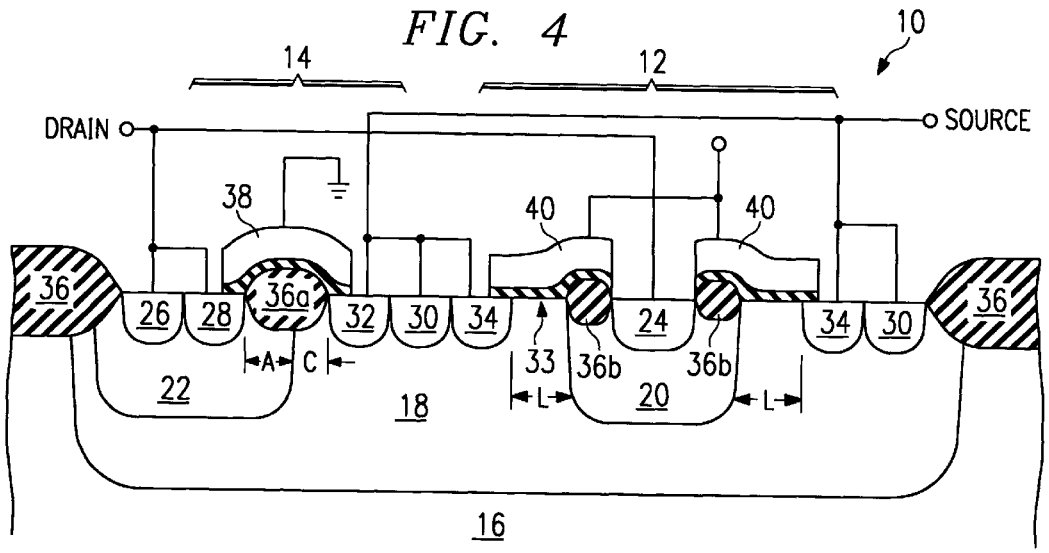
FIG. 4 is a cross-sectional view of a power device having built-in ESD robustness according to the invention.
Figure 5:
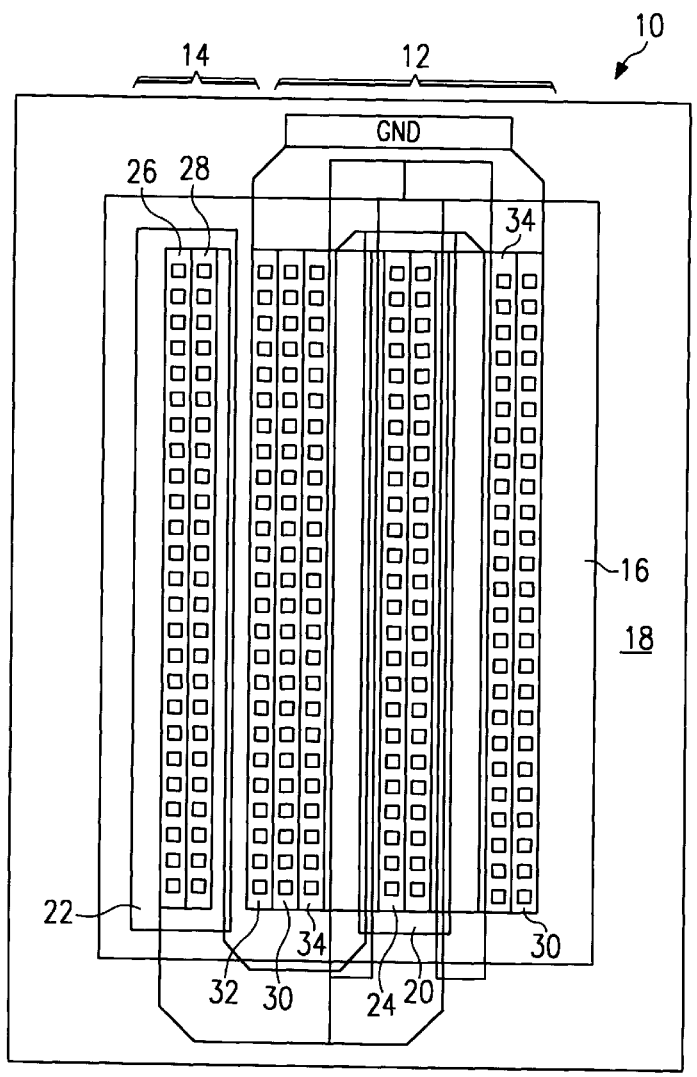
FIG. 5 is a layout of the power device of FIG. 4.

A power device 10 having built-in ESD robustness according to the invention is shown in FIGS. 4 and 5. The power device 10 comprises a SCR (Silicon-Controlled Rectifier) 14 merged into a DEnMOS 12. A SCR is a device having four alternate layers of n and p type silicon which functions as a current controlled switch. A SCR normally acts as an open circuit but switches rapidly to a conducting state when an appropriate signal (such as an ESD event) is applied to the gate terminal.

Device 10 is located in a p-tank 18 formed on a p-type substrate 16. Two "high" voltage n-wells 20 and 22 are located within p-tank 18. The term high voltage refers to a breakdown voltage across the n-well/p-tank junction greater than 40 V. For a typical high voltage process, this n-tank could be either low voltage n-tank (LVN) or a high voltage n-tank (HVN). LVN is same as normally used for the 5 v CMOS and HVN is used for building power DMOS transistors. Drain region 24 of DEnMOS 12 is a n-type diffused region located within n-well 20. Because the breakdown across the n+ diffusion 24 and the n-well 20 is very high, the breakdown voltage of the drain is determined by the n-well 20/p-tank 18 junction. For this reason, a high voltage n-well is used for n-well 20.

The anode 28 of SCR 14 is a p-type diffused region located in n-well 22. A n+ diffused region 26 is also located in n-well 22. Region 26 provides a n+ contact to the n-well 22 on the anode side of the SCR 14. Region 26 prevents the triggering of the inherent vertical pnp for latchup immunity. Both region 26 and anode 28 are connected to the drain region 24 of DEnMOS 12.

It should be noted again that the n-well 22 could be low voltage n-well (LVN) or high voltage n-well (HVN) for n-well 22. A LVN will make the SCR trigger more consistent by reducing the SCR trigger voltage. A disadvantage of the low voltage n-well is additional process complexity in forming the power device as will be discussed below.

Drain region 24 of DEnMOS 12 is surrounded by source diffusions 34 on either side. Source diffusions 34 are n+ regions located in p-tank 18 and are connected to ground. The space between source diffusions 34 and the n-well 20 form the channel regions 33 of DEnMOS 12. The channel length is denoted "L".

Also formed in p-tank 18 are p+ diffused regions 30 and cathode 32. P+ diffused regions 30 are located in p-tank 18 adjacent source diffusions 34. Regions 30 form a backside contact (i.e., a contact to the substrate). The cathode 32 of SCR 14 is a n+ diffused region located in p-tank 18 adjacent one of the p+ diffused regions 30. Regions 30 and cathode 32 are connected to source diffusions 34 and the source potential (SOURCE).

The pnpn junctions of the SCR 14 are thus formed by the anode 28, n-well 22, p-tank 18 and cathode 32, respectively. The spacings "A" and "C" for the SCR and the channel length "L" of the DEnMOS 12 will determine the effective trigger for the SCR 14. The spacings are chosen so as to protect the DEnMOS drain 24 under an ESD event.

Field oxide regions 36 separate device 10 from other devices (not shown), the anode 28 of SCR 14 from the cathode 32, and the drain 24 of DEnMOS 12 from channel region 33. A SCR polysilicon gate 38 may optionally be placed over field oxide region 36a to adjust for variations in breakdown voltages and/or further ensure the margin between the SCR trigger and the DEnMOS drain 24 avalanche. DEnMOS gate 40 extends over the channel region 33 and partially over field oxide region 36b.

The efficiency of the ESD protection of power device 10 will depend on the choice of "A" and "C" spacings relative to the DEnMOS channel length "L". If "L" is greater than "A" and "C", the SCR 14 will trigger before the drain avalanche of the DEnMOS 12. For a typical application A=C=3 μm and L=5 μm.

The variation of "A" and "C" will control the SCR trigger. If C>A, the SCR holding voltage can be increased but this will have an adverse impact on the SCR trigger voltage by increasing the trigger level. Placing a poly gate connected to ground between the anode 28 and the cathode 32 of the SCR 14 will help lower the SCR trigger voltage back down. This is due to the bending of the depletion region under the influence of the SCR gate 38 which favors a lower trigger for the SCR 14. Changing the SCR n-well 22 to a low voltage n-well may also help in making the SCR trigger more consistent. Thus, even if L=A=C, the SCR gate and or the use of a low voltage n-well will make the SCR trigger consistent to protect the DEnMOS drain from avalanche.

As long as the drain voltage stays in the designed operating range of the device 10 and below the SCR trigger voltage, the SCR 14 will not have any impact on the I–V characteristics of the DEnMOS. In fact, the DEnMOS transistor can be laid out in a multi-finger structure while forming the SCR with last finger as shown in FIG. 5.

However, when the drain voltage exceeds the designed operating range of the device and reaches the SCR trigger voltage, such as during an ESD event, the SCR 14 will trigger and reduce the voltage at the drain to the holding voltage. The holding voltage will typically be below 5 V. Thus, the relative power dissipation under the ESD event is greatly reduced. This will result in a high self-protection level. As long as the SCR trigger voltage remains below the $BV_{dss}$, no damage will occur to the DEnMOS transistor during an ESD event.

Figure 6:
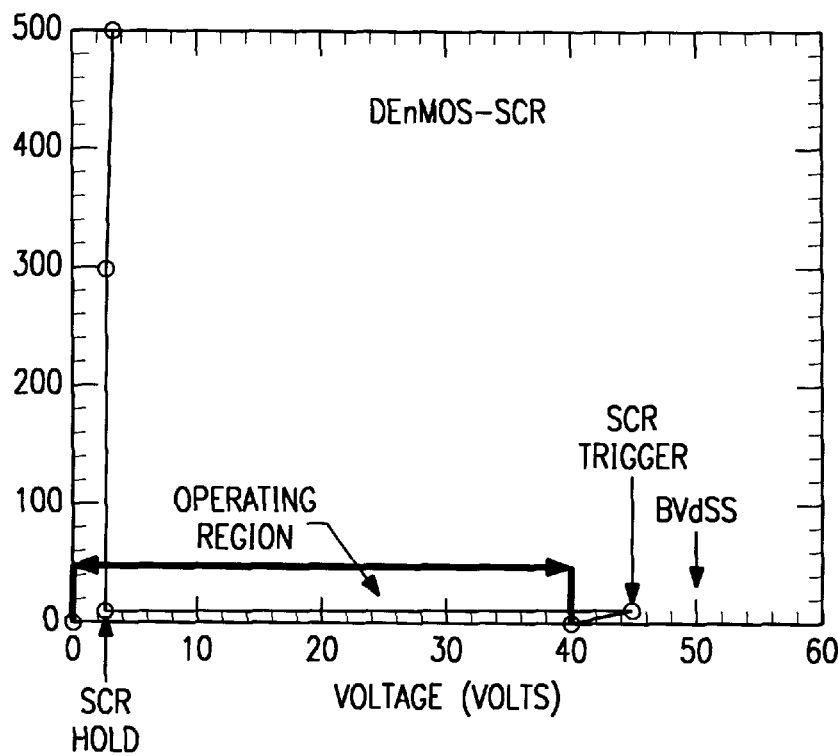
FIG. 6 is a graph if I–V characteristics of a power device according to the invention.

In FIG. 6, the high current I–V characteristics are shown for a power device 10 having a merged DEnMOS-SCR. SCR spacings "A" and "C" are 3 μm and the channel length "L" is 5 μm. The critical SCR trigger is at 45 V which is below the drain avalanche (at 50 V) of the DEnMOS but outside the circuit operating region. Also, the SCR holding voltage is low (at 4 V) which improves the ESD performance over the standard DEnMOS device.

Figure 7:
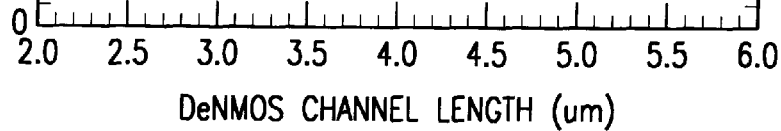
FIG. 7 is a graph of ESD data of a power device according to the invention.

The ESD results for the power device according to the invention are shown in FIG. 7. The minimum HBM ESD levels were measured as a function of channel length for only a 200μm wide structure. For channel lengths greater than 3.5 μm, the required 4 KV ESD protection level for automotive applications is achieved for both the cases with and without the SCR gate. For the case where a poly gate for the SCR was not used, the ESD level improves as the channel length is increased. This is due to the fact that the drain breakdown voltage ($BV_{dss}$) of the DEnMOS becomes higher than the SCR trigger.

When a poly gate for the SCR is used, the ESD protection shifts to a higher range. Even at a channel length of 3μm, the SCR gate helps in lowering the trigger and consequently improve the minimum protection level. With the SCR gate 38 tied at ground potential, the n-well 22 depletion region is modified to favor a lower breakdown and hence a better trigger for the SCR. Therefore, a SCR poly gate built into the power device will offer good protection for typical channel lengths of a DEnMOS transistor. It should be noted that, for practical applications, the SCR gate may alternatively be tied to the DEnMOS gate.

A method for the formation of power device 10 into a p-type substrate 16 having a p-tank 18 formed therein will now be described.

Figure 8A:
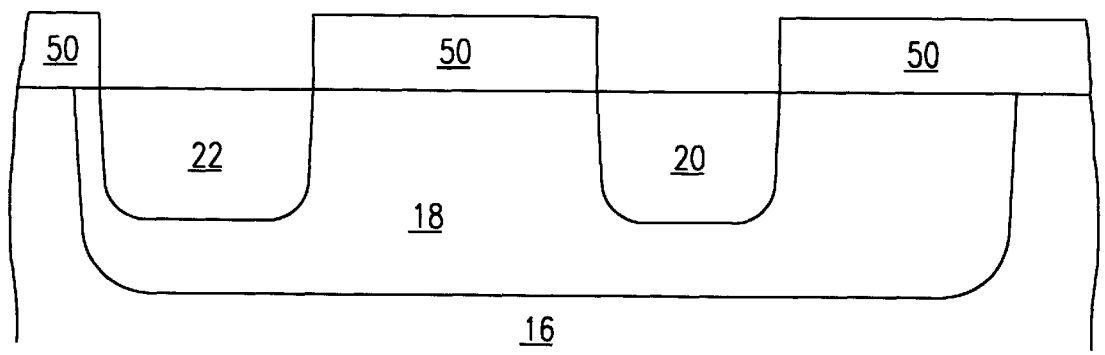
Figure 8B:
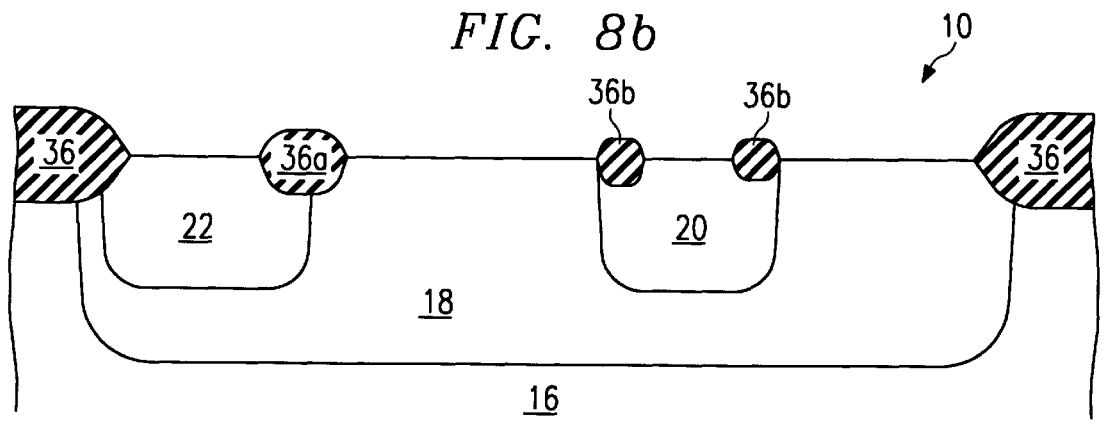

Referring to FIG. 8a, a masking layer 50 is formed over the surface of the structure to expose the areas where the low voltage n-wells (LVNs) 20 and 22 are to be formed. LVNs 20 and 22 are formed by implantation and diffusion of an n-type dopant such as phosphorus and/or arsenic. The dopant concentration and depth of LVNs will vary by design, but will typically be on the order of $6E16/cm^3$ for a breakdown voltage approximately 70 V and 1–3 $\mu$m, respectively. If a HVN is desired for n-well 22, two implantation steps would be needed to achieve the different doping concentrations required by LVN 20 and HVN 22. A HVN may typically have a dopant concentration on the order of $1E16/cm^3$ for a breakdown voltage of approximately 95 V. However, a single diffusion step may still be used. Masking layer 50 is then removed. Next, field oxide regions 36 are formed at the surface of the structure as shown in FIG. 8b. Methods for forming field oxide regions are well known in the art. One method for forming field oxide regions 36 is described in U.S. Pat. No. 4,541,167, issued Sep. 17, 1985 and assigned to Texas Instruments Incorporated.

Figure 8C:
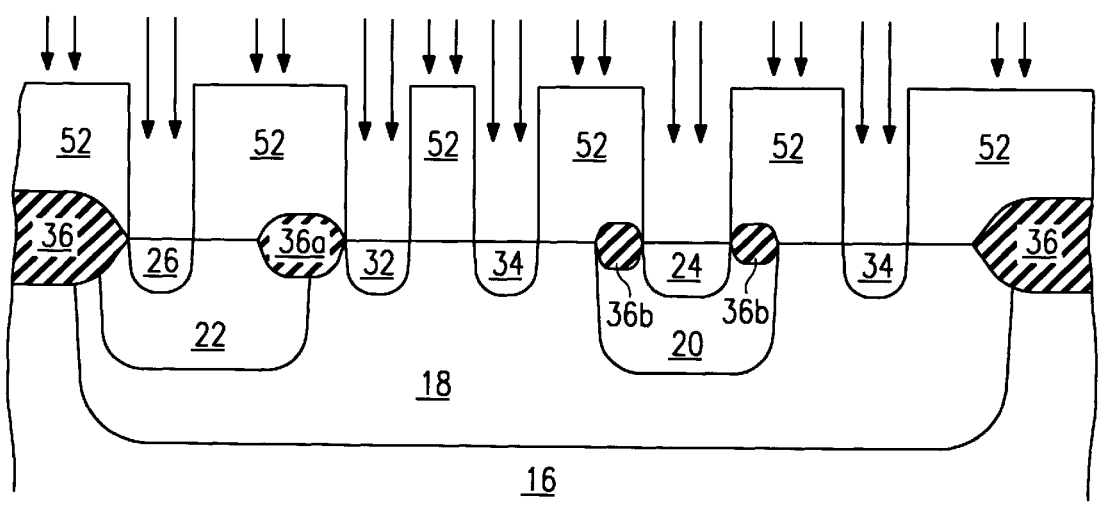

Referring to FIG. 8c, masking layer 52 is formed over the surface of the structure to expose areas where n+ diffused regions 24, 26, 32, and 34 are to be formed. N+ diffused regions 24, 26, 32, and 34 are formed by implantation and diffusion of an n-type dopant such as phosphorus and/or arsenic. A dopant concentration on the order of $1 \times 10^{20}/cm^3$ may be used. Masking layer 52 is removed and replaced with masking layer 54 as shown in FIG. 8d. Masking layer 54 exposes those areas of the structure where p+ diffused regions 28 and 30 are to be formed. P+ diffused regions 28 and 30 are formed by implantation and diffusion of a p-type dopant such as boron. A dopant concentration on the order of $1 \times 10^{20}/cm^3$ may be used. Masking layer 54 is then removed. It should be noted that a single diffusion step could be used for both the n+ and p+ regions.

Next, a gate oxide 56 is formed over the surface of the structure as shown in FIG. 8e. Gate oxide 56 may have a thickness on the order of 500 Å. This is followed by a deposition of polysilicon 58 over gate oxide 56. Gate oxide 56 and polysilicon 58 are then etched to form SCR gate 38 and DEnMOS gate 40 as shown in FIG. 8f. It should be noted that SCR gate 38 is optional but is desired for more efficient performance under ESD.

Finally, the desired interconnections are formed according to methods well known in the art. Referring to FIG. 4, n+ region 26, p+ region 28 (anode), and n+ region 24 (drain) are connected together and tied to a drain potential DRAIN. N+ region 32 (cathode), p+ region 30, and n+ regions 34 (source) are connected together and tied to a source potential (SOURCE). SCR gate 38, if present, may be connected to a ground potential.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A power device having built-in ESD protection comprising:
   a drain extended MOS transistor located in a tank region of a first conductivity type, said drain extended MOS transistor including:
      a first well region of a second conductivity type opposite said first conductivity tyPe located in said tank;
      a drain of said second conductivity type located in said first well region;
      a source of said second conductivity type located in said tank and separated from said first well region by a channel region in said tank;
      a gate extending over said channel region; and
   a silicon controlled rectifier merged with said drain extended MOS into said tank region, said silicon controlled rectifier including:
      a second well region of said second conductivity type located in said tank region;
      an anode region of the first conductivity type located in said second well region, said anode region connected to said drain;
      a cathode region of the second conductivity type located in said tank and spaced from said source, said cathode region connected to said source.

2. The device of claim 1, wherein said first conductivity type is p-type and said second conductivity type is n-type.

3. The device of claim 1, further comprising a doped region of the same conductivity type as said second well region, said doped region located within said second well region to provide latchup immunity.

4. The device of claim 1, wherein a channel length of said drain extended MOS is greater than a spacing between said anode and an edge of said second well region and greater than a spacing between said cathode and said edge of said second well region.

5. The device of claim 1, further comprising:
   a. a field oxide region located between said anode and said cathode; and
   b. a gate located over said field oxide region.

6. The device of claim 5, wherein said gate is connected to a ground potential.

7. The device of claim 5, wherein said gate is connected to a gate potential of said drain extended MOS.

8. The device of claim 1, wherein said first and second well regions are high voltage well regions.

9. The device of claim 3 wherein said first well region is a high voltage well region and said second well region is a low voltage well region.

10. The device of claim 1, wherein said drain extended MOS has a multi-finger configuration with said silicon controlled rectifier comprising an end finger adjacent said multi-finger configuration.

11. The device of claim 1, further comprising a doped region of said first conductivity type located in said tank between said source and said cathode region and connected to said source and said cathode region.

12. A power device having built-in ESD robustness, comprising:
   a. a drain extended nMOS located in a tank region of a first conductivity type, said drain extended NMOS comprising:

i. a first well region of a second conductivity type;

ii. a first doped region of said second conductivity type located in said first well region, said first doped region forming a drain;

iii. a second doped region of said second conductivity type located in said tank region and separated from an edge of said first well region by a first spacing, said second doped region forming a source; and iv. a gate extending over said tank region between said source and said drain;

b. a silicon controlled rectifier located in said tank region, said silicon controlled rectifier comprising:

i. a second well region of said second conductivity type;

ii. a third doped region of said first conductivity type located in said second well region and separated from an edge of said second well region by a second spacing, said third doped region forming an anode; and iii. a fourth doped region of said second conductivity type located in said tank region and separated from said edge of said second well region by a third spacing.

13. The device of claim 12, wherein said anode is connected to said drain and said cathode is connected to said source of said drain extended nMOS.

14. The device of claim 12, wherein said first spacing is greater than said second and third spacings.

15. The device of claim 12, wherein said second spacing is greater than or equal to said third spacing.

16. The device of claim 12, further comprising a fifth doped region of said second conductivity type located in said second well region to provide latchup immunity, said fifth doped region connected to said drain.

17. The device of claim 12, wherein the dopant concentration of said first well region is approximately equal to the dopant concentration of said second well region.

18. The device of claim 12, wherein the dopant concentration of said first well region is less than the dopant concentration of said second well region.

19. The device of claim 12, further comprising:

a. a field oxide region located between said anode and said cathode; and b. a polysilicon gate located over said field oxide region.

* * * * *